(12) United States Patent
Swaans

(10) Patent No.: US 11,280,845 B2
(45) Date of Patent: Mar. 22, 2022

(54) TESTING SYSTEM FOR USE IN TESTING OF WIRELESS POWER TRANSFER AND AN ASSOCIATED TESTING DEVICE AND METHOD

(71) Applicant: ElectDis AB, Malmö (SE)

(72) Inventor: Laurens Swaans, Malmö (SE)

(73) Assignee: ElectDis AB, Malmö (SE)

(*) Notice: Subject to any disclaimer, the term of this patent is extended or adjusted under 35 U.S.C. 154(b) by 340 days.

(21) Appl. No.: 16/338,752

(22) PCT Filed: Oct. 12, 2017

(86) PCT No.: PCT/EP2017/076135
§ 371 (c)(1),
(2) Date: Apr. 2, 2019

(87) PCT Pub. No.: WO2018/069478
PCT Pub. Date: Apr. 19, 2018

(65) Prior Publication Data
US 2021/0208205 A1 Jul. 8, 2021

(30) Foreign Application Priority Data
Oct. 12, 2016 (SE) .................................. 1651339-2

(51) Int. Cl.
*H02J 50/00* (2016.01)
*G01R 31/40* (2020.01)
(Continued)

(52) U.S. Cl.
CPC .............. *G01R 31/40* (2013.01); *H02J 50/12* (2016.02); *H02J 50/402* (2020.01); *H02J 50/80* (2016.02); *H04B 5/0037* (2013.01); *H04B 17/29* (2015.01)

(58) Field of Classification Search
CPC ........... H02J 50/00; H04B 5/00; H04B 17/29; G01R 31/40
(Continued)

(56) References Cited

U.S. PATENT DOCUMENTS

| | | | | |
|---|---|---|---|---|
| 8,933,583 B2 * | 1/2015 | Uchida | ................... | H02J 7/025 307/11 |
| 2009/0286476 A1 * | 11/2009 | Toncich | ................... | H01Q 7/00 455/41.1 |

(Continued)

FOREIGN PATENT DOCUMENTS

| | | |
|---|---|---|
| JP | 2013128385 A | 6/2013 |
| SE | 1451306 A1 | 3/2016 |

(Continued)

OTHER PUBLICATIONS

International Search Report and Written Opinion for International Application PCT/EP2017/076135, dated Nov. 23, 2017.

*Primary Examiner* — Adi Amrany
(74) *Attorney, Agent, or Firm* — Honigman LLP

(57) ABSTRACT

A testing system (90) for use in testing of wireless power transfer is disclosed. The testing system has at least one wireless power receiver circuit (34) for receiving inductive power from an external wireless power transmitter (20). The testing system is arranged to detect received inductive power at least two operating frequencies relating two both a wireless power standard and a wireless communication standard. Measurements data originating from inductive power received adopting the wireless communication standard is forwarded to a processing means (42) which based on reference data is arranged to detect whether a communication receiver circuit (15) and arranged to communicate according to the wireless communication standard adopting the second frequency range, when arranged in operative proximity to the external wireless power transmitter device (20), would be negatively affected by the inductive power transmitted from the external wireless power transmitter device (20).

11 Claims, 5 Drawing Sheets

(51) Int. Cl.
*H04B 17/29* (2015.01)
*H02J 50/80* (2016.01)
*H02J 50/12* (2016.01)
*H02J 50/40* (2016.01)
*H04B 5/00* (2006.01)

(58) Field of Classification Search
USPC .................................................. 307/104
See application file for complete search history.

(56) References Cited

U.S. PATENT DOCUMENTS

| | | | |
|---|---|---|---|
| 2010/0244580 A1* | 9/2010 | Uchida | H02J 7/025 307/104 |
| 2011/0127846 A1 | 6/2011 | Urano | |
| 2012/0242161 A1 | 9/2012 | Kudo et al. | |
| 2014/0354041 A1* | 12/2014 | Yoshi | H02J 7/025 307/9.1 |
| 2016/0037286 A1 | 2/2016 | Narasimhan | |
| 2016/0172869 A1* | 6/2016 | Park | H02J 50/40 307/104 |
| 2016/0254690 A1 | 9/2016 | Heiberg et al. | |
| 2016/0282192 A1* | 9/2016 | Wikstrand | G01K 1/14 |
| 2016/0359371 A1* | 12/2016 | Wikstrand | G01R 31/42 |
| 2017/0047784 A1* | 2/2017 | Jung | H02J 50/80 |
| 2020/0355751 A1* | 11/2020 | Swaans | G01R 31/42 |

FOREIGN PATENT DOCUMENTS

| | | |
|---|---|---|
| SE | 1550340 A1 | 6/2016 |
| SE | 538687 C2 | 10/2016 |

\* cited by examiner

TESTING SYSTEM FOR USE IN TESTING OF WIRELESS POWER TRANSFER AND AN ASSOCIATED TESTING DEVICE AND METHOD

CROSS-REFERENCE TO RELATED APPLICATIONS

This application is a 35 USC § 371 United States national stage application of International Application No. PCT/EP2017/076135, filed Oct. 12, 2017, which claims priority to Swedish Patent Application No. 1651339-2, filed Oct. 12, 2016, both of which are incorporated herein by reference.

TECHNICAL FIELD

The present invention generally relates to the field of wireless power transfer, and more specifically to testing of wireless power transfer. Even more specifically, the present invention relates to a testing system capable of detecting whether an external device comprising a particular communication receiver circuit arranged to communicate according to a wireless communication standard and a wireless power receiver coil operating according to a conventional wireless power transfer standard for receiving inductive power, may be negatively affected if put in close proximity to external wireless power transmitter device when operating in its inductive charging mode.

BACKGROUND

Wireless power transfer is expected to become increasingly popular, for instance for wireless battery charging of mobile devices such as, for instance, mobile terminals, tablet computers, laptop computers, cameras, audio players, rechargeable toothbrushes, wireless headsets, as well as various other consumer products and appliances.

The Wireless Power Consortium has developed a wireless power transfer standard known as Qi. Other known wireless power transfer approaches include Alliance for Wireless Power, and Power Matters Alliance.

The wireless power transfer standard known as Qi by the Wireless Power Consortium (WPC) will be referred to, without limitation, throughout this document as the presently preferred wireless power transfer manner applicable to the present invention. However, the invention may generally be applied also to other wireless power transfer standards or approaches, including but not limited to the ones mentioned above. Also, this disclosure is not limited to any particular power range but includes, without limitation, low power applications as well as medium power applications and high power applications.

Operation of devices that comply with Qi relies on magnetic induction between planar coils. Two kinds of devices are involved, namely devices that provide wireless power (referred to as base stations), and devices that consume wireless power (referred to as mobile devices). Power transfer takes place from a base station to a mobile device. For this purpose, a base station contains a subsystem (a power transmitter) that comprises a primary coil, whereas a mobile device contains a subsystem (a power receiver) that comprises a secondary coil. In operation, the primary coil and the secondary coil will constitute the two halves of a coreless resonant transformer.

Typically, a base station has a flat surface, on top of which a user can place one or more mobile devices so as to enjoy wireless battery charging or operational power supply for the mobile device(s) placed on the base station.

As with most electric power applications, there is a need to test the devices involved in wireless power transfer. There are several reasons why testing is important; regulatory requirements, manufacturer liability and market competition are a few examples.

In wireless power transfer, there is a desire to measure the energy received by the mobile device (also referred to as external device throughout the present specification) in order to assess the capability of the wireless power transmitter device 20 to deliver wireless power according to a given rating, criterion or standard, and/or to verify compliance with an applicable wireless power transfer standard.

Also, it is desired to test the communication between the transmitter (base station) and receiver (mobile device). In, for instance, Qi Extended Power Profile (EPP), the wireless power transfer is controlled by way of complex handshaking and signaling between the devices, i.e. a bidirectional communication between the devices. In, for instance, Qi Baseline Power Profile (BPP), there is a unidirectional communication where the receiver (mobile device) sends control messages to the transmitter (base station).

Moreover, there is a desire to evaluate the thermal exposure of a mobile device when being subjected to wireless power transfer from a wireless power transmitter. This is because during operation, heat will be generated by magnetic induction in the secondary coil of the power receiver, i.e. in the mobile device. Also, the power transmitter in the base station will generate heat that will be conveyed from the base station to the mobile device. If the thermal exposure for the mobile device becomes excessive, several undesired effects may arise. For instance, vital components may be damaged in the mobile device, such as for instance a lithium ion battery or electronic circuitry in a smartphone. At severe overheating, objects in the vicinity of the mobile device may be damaged and even cause a fire or toxic smoke hazard. Furthermore, the duration of the charging period may be prolonged, since protective circuitry in the mobile device may intervene to reduce or even suspend the charging power until the temperature has been reduced again.

Base stations can be tested by the provision of respective testing devices which comprise a wireless power receiver coil that can pick up the wireless power generated by the transmitter coil of the base station to be tested. By placing such a testing device on or otherwise adjacent to the base station and connecting the testing device to a host device, the host device may run various wireless power transfer tests by driving the wireless power receiver coil in a manner which mimics the intended operation of a mobile device from the base station's perspective, By monitoring the resulting behavior of the testing device, the host device may evaluate the performance of the base station and also identify potentially abnormal behavior of the base station. Since there are several different types of wireless power coils on the market, several different types of testing devices may also be required.

However, to perform these tests accurately, the host device needs to know certain information about the wireless power receiver coil. Such information can be hard-coded into the test session program run by the host device, or retrieved from a settings file or database at runtime. Alternatively, it may be entered manually by a test operator before or during the execution of the test session program.

The present inventor has identified problems and shortcomings with these approaches, since they are potentially error-prone and complicated.

Hence, there is an expected need among different interest groups to be able to perform improved tests of wireless power transfer, taking the problems and shortcomings listed above into account. Such interest groups may for instance involve any of the following: developers, manufacturers or suppliers of wireless power transmitter devices; test or compliance entities in the field of wireless power transfer; and test or compliance entities in the field of consumer product safety.

SUMMARY

It is accordingly an object of the present invention to offer improvements in the technical field of wireless power transfer.

In accordance with a first aspect a testing system for use in testing of wireless power transfer is provided. The testing system comprises a testing device having a first wireless power receiver circuit arranged to receive inductive power from an external wireless power transmitter device. The testing device further comprises either a tuning circuit for tuning the operating frequency range of the first wireless power receiver circuit to enable detection of wireless power transmitted from the external wireless power transmitter device in the first wireless power receiver circuit according to both a wireless power standard adopting a first operating frequency range and a wireless communication standard adopting a second operating frequency range being different from the first operating frequency range, or a second wireless power receiver circuit arranged to receive inductive power in a second operating frequency range according to a wireless communication standard adopting a second operating frequency range, wherein the first wireless power receiver circuit is arranged to receive inductive power in a first operating frequency range according to a wireless power standard, and wherein the second operating frequency range is different from the first operating range. Furthermore, the testing device comprises an interface operatively coupled to the first wireless power receiver circuit or the first and second wireless power receiver circuits to provide measurement data to a host device also being comprised in the testing system. The host device comprises a processing means operatively coupled to an electronic memory having stored thereon reference data related to characteristics of the wireless communication standard adopting the second frequency range. The processing means is arranged to receive the measurement data associated with the second frequency range from the interface, and determine whether a communication receiver circuit provided in an external device and arranged to communicate according to the wireless communication standard adopting the second frequency range, when arranged in operative proximity to the external wireless power transmitter device, would be negatively affected by the inductive power transmitted from the external wireless power transmitter device, based on a comparison between the measurement data associated with the second frequency range and the reference data.

According to a second aspect a testing device for use in testing of wireless power transfer is provided. The testing device comprises a first wireless power receiver circuit (34a) arranged to receive inductive power from an external wireless power transmitter device (20). The testing device further comprises either of: a tuning circuit for tuning the operating frequency range of the first wireless power receiver circuit to enable detection of wireless power transmitted from the external wireless power transmitter device in the first wireless power receiver circuit according to both a wireless power standard adopting a first operating frequency range and a wireless communication standard adopting a second operating frequency range being different from the first operating frequency range; or a second wireless power receiver circuit arranged to receive inductive power in a second operating frequency range according to a wireless communication standard adopting a second operating frequency range, wherein the first wireless power receiver circuit is arranged to receive inductive power in a first operating frequency range according to a wireless power standard, and wherein the second operating frequency range is different from the first operating range. The testing device further comprises an interface operatively coupled to the first wireless power receiver circuit or the first and second wireless power receiver circuits to provide measurement data to a host device.

According to a third aspect a method of testing wireless power transfer from an external wireless power transmitter device having a wireless power transmitter coil is provided. The method comprises providing a testing system as defined in accordance with the first aspect. The method further comprises placing the testing device of the testing system on, at or near the external wireless power transmitter device. Moreover, the method comprises connecting the interface to the host device. Furthermore, the method comprises receiving, by the processing means, measurement data originating from the first wireless power receiver circuit or second wireless power receiver. The method further comprises accessing reference data related to characteristics of the wireless communication standard adopting the second frequency range. Moreover, the method comprises determining, by the processing means, whether a communication receiver circuit provided in an external device and arranged to communicate according to the wireless communication standard adopting the second frequency range, when arranged in operative proximity to the external wireless power transmitter device, would be negatively affected by the inductive power transmitted from the external wireless power transmitter device, based on a comparison between the measurement data associated with the second frequency range and the reference data.

Embodiments of the invention are defined by the appended dependent claims and are further explained in the detailed description section as well as on the drawings.

It should be emphasized that the term "comprises/comprising" when used in this specification is taken to specify the presence of stated features, integers, steps, or components, but does not preclude the presence or addition of one or more other features, integers, steps, components, or groups thereof. All terms used in the claims are to be interpreted according to their ordinary meaning in the technical field, unless explicitly defined otherwise herein. All references to "a/an/the [element, device, component, means, step, etc]" are to be interpreted openly as referring to at least one instance of the element, device, component, means, step, etc., unless explicitly stated otherwise. The steps of any method disclosed herein do not have to be performed in the exact order disclosed, unless explicitly stated.

Directions and orientations is three-dimensional space for the testing device as described herein are generally expressed with respect to a horizontal orientation for the testing device, corresponding to the testing device lying on a horizontal surface.

BRIEF DESCRIPTION OF THE DRAWINGS

Objects, features and advantages of embodiments of the invention will appear from the following detailed description, reference being made to the accompanying drawings.

DETAILED DESCRIPTION

Figure 1:
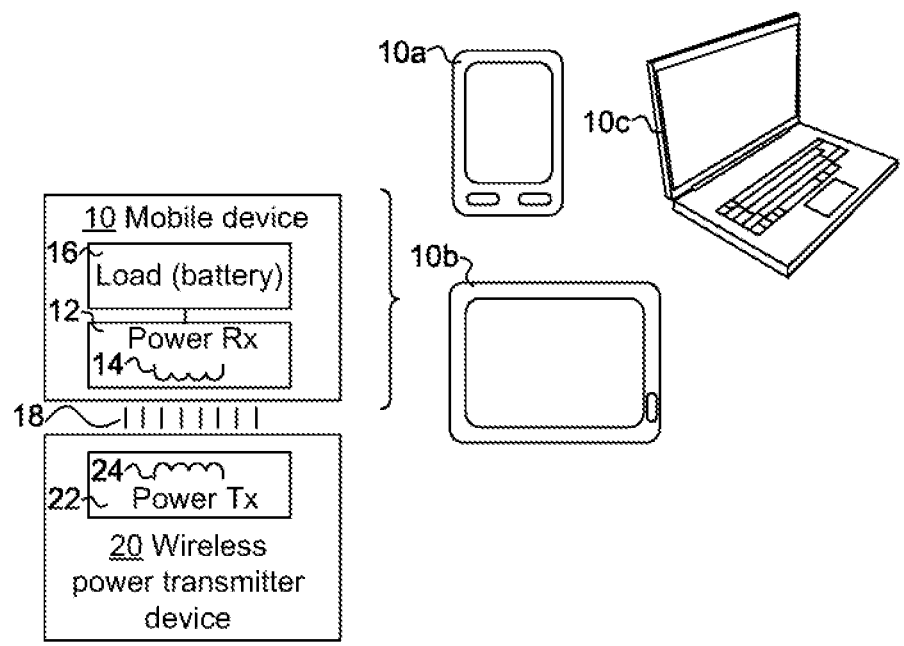
FIG. 1 is a schematic block diagram of a conventional setup of an external wireless power transmitter device for wireless power transfer to a mobile device.

Embodiments of the invention will now be described with reference to the accompanying drawings. The invention may, however, be embodied in many different forms and should not be construed as limited to the embodiments set forth herein; rather, these embodiments are provided so that this disclosure will be thorough and complete, and will fully convey the scope of the invention to those skilled in the art. The terminology used in the detailed description of the particular embodiments illustrated in the accompanying drawings is not intended to be limiting of the invention. In the drawings, like numbers refer to like elements.

FIG. 1 illustrates a conventional setup of an external wireless power transmitter device 20 for wireless power transfer to a mobile device 10. The mobile device may, for instance, be a mobile terminal (e.g. smartphone) 10a, tablet computer 10b, laptop computer 10c, camera, audio player, rechargeable toothbrush, wireless headset, or another kind of consumer product or appliance.

Here, the external wireless power transfer is compliant with the Qi standard by the Wireless Power Consortium; hence, the external wireless power transmitter device 20 is a base station in the Qi terminology. However, as already mentioned, it should be appreciated that the invention is generally applicable also to other wireless power transfer standards or approaches, including but not limited to the ones mentioned in the Background section.

The external wireless power transmitter device 20 comprises a wireless power transmitter 22 having a wireless power transmitter coil 24. Correspondingly, the mobile device 10 comprises a wireless power receiver 12 having a wireless power receiver coil 14. In operation, the wireless power transmitter device 20 will transfer power wirelessly to the mobile device 10 by way of inductive coupling 18 via the wireless power transmitter coil 24 and wireless power receiver coil 14.

The power received by the wireless power receiver coil 14 will drive a load 16 in the mobile device 10. Typically, the load 16 may be a rechargeable battery, such as a lithium ion battery; hence, the wireless power transmitter device 20 will act as a wireless power charger for the mobile device 10. In another scenario, the load 16 may be electronic circuitry in the mobile device, wherein the wireless power transmitter device 20 will act as a wireless power supply for the mobile device 10.

As explained in the Background section, it is desired to be able to test the performance of the wireless power transmitter device 20 with respect to its intended use with mobile devices, such as mobile device 10. More particularly, most inductively chargeable devices, e.g. mobile devices, do not only comprise a power receiving coil adapted for receiving inductive power. Other components for wireless communication, e.g. near field communication (NFC) antennae, may be present within the chargeable device.

The present inventor has realized that electromagnetic field generated for wireless power transfer can disturb other electromagnetic signals such as used in communication devices (e.g. NFC, RFID). In extreme cases the transmitter could even induce such a high voltage into these communication devices that the communication device gets permanently damaged beyond repair.

The present invention aims to provide a solution for testing the (negative) impact on such components caused by the wireless charger under test, and in particular components not necessarily operating in the same operating frequency range as the power receiving coil of the chargeable device. Accordingly, just because a chargeable device, e.g. a mobile device, is capable of inductive power charging, there is an imminent risk that other components, e.g. comprising coils or antennae, within the device may be negatively affected, or even damaged, by the inductive power transmitted by the external wireless power transmitter device. Hence, even if the inductive power transmitted to the power receiving coil of the mobile device follows the Qi standard, other components of the mobile device could be damaged by the electromagnetic field created by the Qi compliant transmitter. The present invention aims to test for this vulnerability without needing the mobile device to be present during the test.

Figure 8:
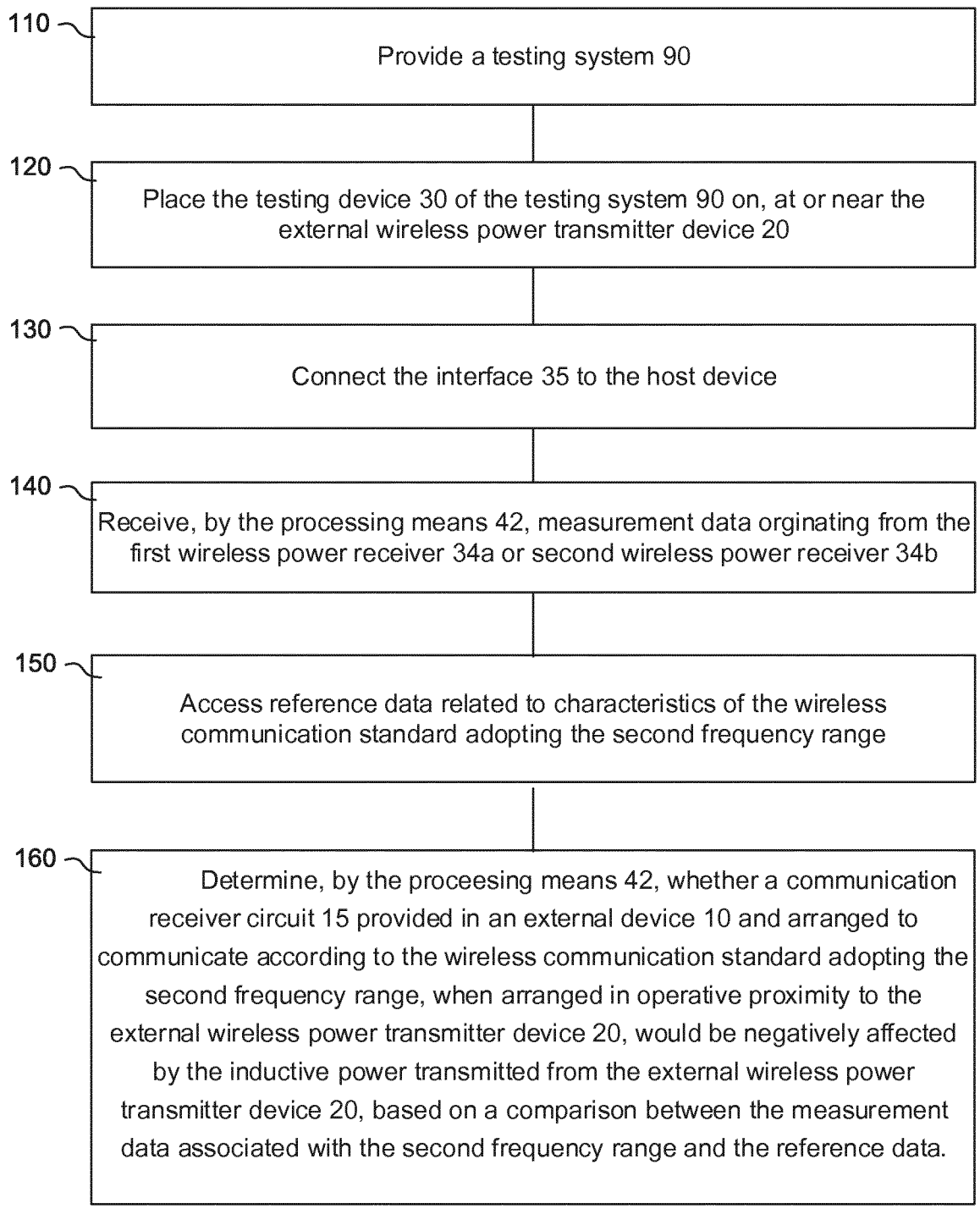
FIG. 8 is a flowchart diagram of a method of testing wireless power transfer from a wireless power transmitter device having a wireless power transmitter coil, involving use of a testing device as referred to above.

To this end, a testing system 90 has been provided, embodiments of which are illustrated in FIGS. 2-7. There is also provided an associated method of testing wireless power transfer from an external wireless power transmitter device having a wireless power transmitter coil. This method is illustrated in FIG. 8.

An underlying concept of the present invention is to provide a system capable of detecting the presence of inductive power in different operating frequency ranges, i.e. both in frequency ranges being associated with conventional wireless power standards as mentioned above, and in addition also presence of inductive power in operating frequency ranges being associated with other wireless communication standards and being different to the operating frequencies associated with the wireless power standards, in order to assess the vulnerability to components operating in the operating frequency ranges of such wireless communication standard when susceptible or being put in close proximity to an external wireless power transmitter in use.

Figure 2:
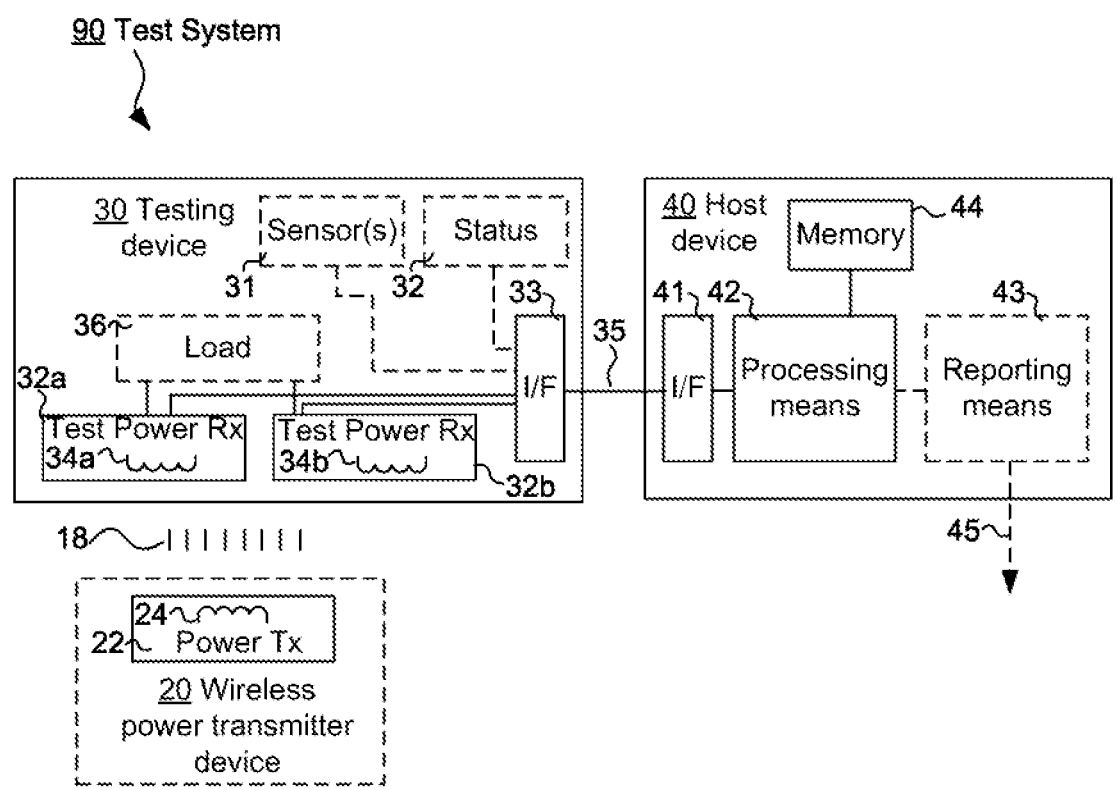
FIG. 2 is a schematic block diagram of a setup for testing of wireless power transfer, including a testing device, a wireless power transmitter device and a host device according to one embodiment.

FIG. 2 is a schematic block diagram which shows a testing system comprising a testing device 30 for use with an external wireless power transmitter device 20 under the control of a host device 40. The external wireless power transmitter device 20 has a wireless power transmitter 22 and a wireless power transmitter coil 24, and may be identical to the wireless power transmitter device 20 in FIG. 1.

Figure 5:
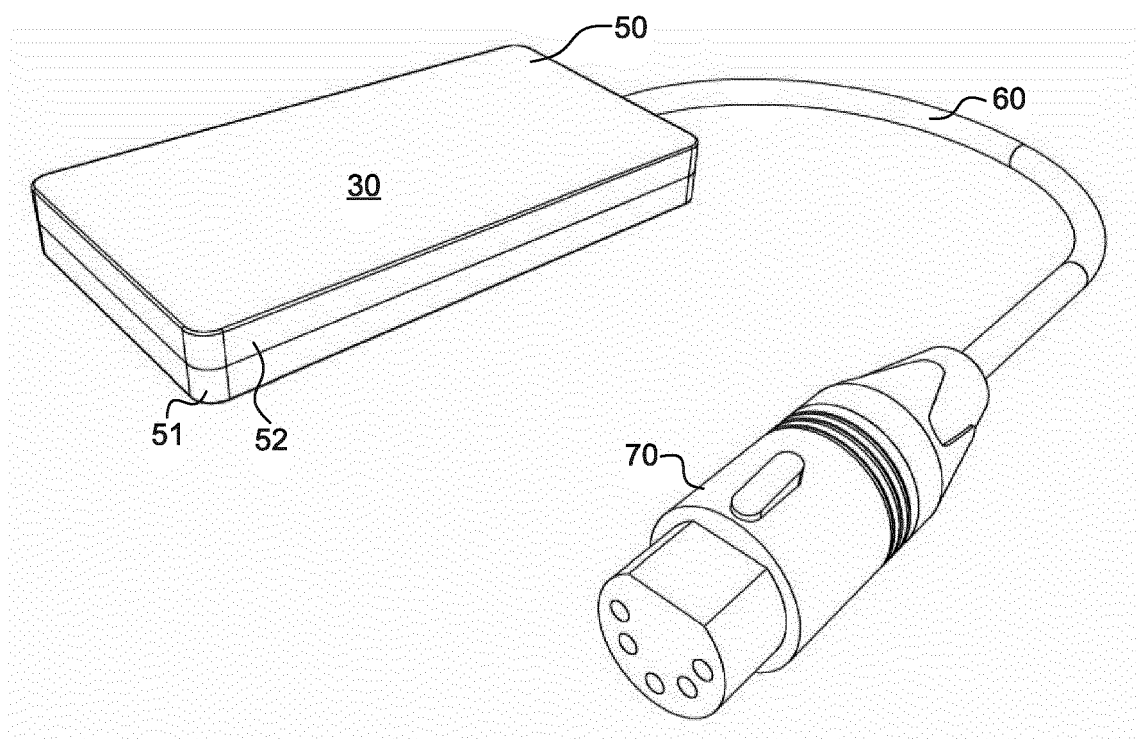
FIG. 5 is an isometric view of the testing device according to one embodiment, seen in an assembled state, the testing device having a cable with a cable connector for connection to the host device.
Figure 6:
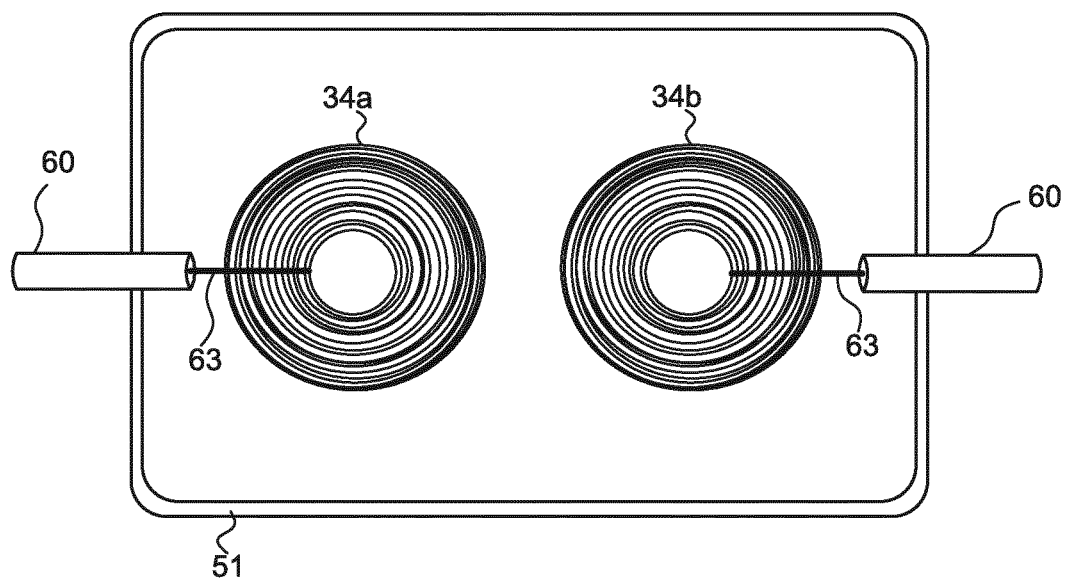
FIG. 6 is a top view of the testing device of FIG. 5, now seen in a disassembled state.
Figure 7:
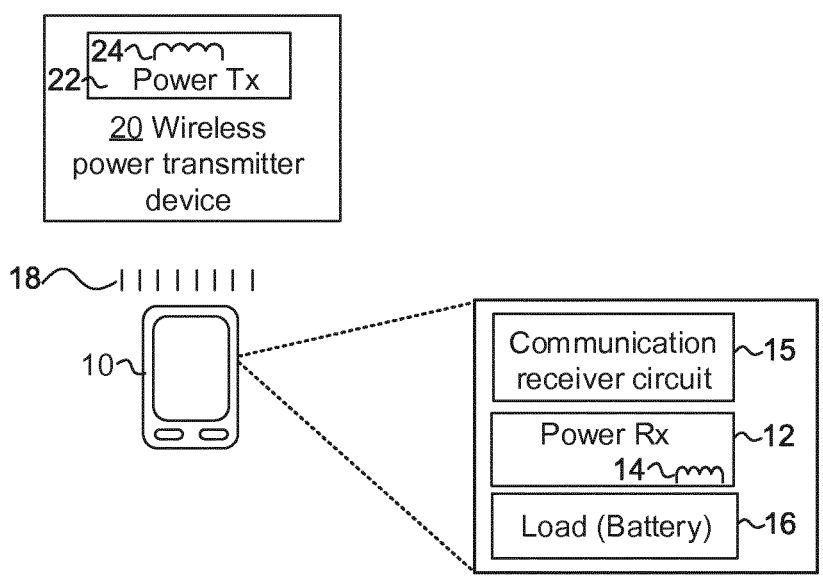
FIG. 7 is a schematic block diagram of a setup for wireless power transfer, including a testing device, a host device and an external device according to one embodiment.

The testing device 30 comprises a first wireless power receiver circuit 34a provided in a housing 50, as perhaps best shown with reference to FIGS. 5 and 6, and arranged to receive inductive power from the external wireless power transmitter device 20. The first wireless power receiver circuit 34a is arranged to receive inductive power in a first operating frequency range according to any conventional wireless power standard, including but not limited to Qi (WPC).

The testing device 30 further comprises a second wireless power receiver circuit 34b arranged to receive inductive power in a second operating frequency range according to a wireless communication standard, wherein the second operating frequency range is different from the first operating range. In this context, "different frequency ranges" may include overlapping frequency ranges. The wireless communication standard may e.g. relate to the NFC communication standard.

An interface 33 is operatively coupled to the first wireless power receiver circuit 34a and/or second wireless power receiver 34b to provide measurement data to a host device 40. The host device 40 may be provided as a separate unit to the housing 50. It is operatively connected to the interface 33, e.g. using a dedicated interface 41 to this end. The host device 40 comprises a processing means 42 operatively coupled to an electronic memory 44 having stored thereon reference data related to characteristics of at least the wireless communication standard adopting the second frequency range.

The processing means 42 is arranged to receive the measurement data associated with the second frequency range from the interfaces 33 and 41. Furthermore, the processing means 42 is arranged to determine whether a communication receiver circuit 15 provided in an external device 10 and arranged to communicate according to the wireless communication standard adopting the second frequency range, when arranged in operative proximity to the external wireless power transmitter device 20, would be negatively affected by the inductive power transmitted from the external wireless power transmitter device 20, based on a comparison between the measurement data associated with the second frequency range and the reference data.

To this end it should be appreciated that the external device 10, e.g. chargeable mobile device, being provided with the communication receiver circuit 15, does not need to be present during the testing as shown with reference to FIGS. 2 to 6. Reference data relating to the particular communication receiver circuit 15 may be obtained previously by measurements or by receipt of specification information from the manufacturer of the external device.

As a non-limiting example the communication receiver circuit 15 may e.g. be an NFC card. NFC cards are readily available and used e.g. to open hotel doors etc. Hence, although the external device 10 could be a mobile device, e.g. a mobile phone or smart phone, it could also be a hotel door card or any other device utilizing a communication receiver circuit. Hence, the external device does not imply that it needs to be chargeable and that it needs to comprise a power receiving coil dedicated to receive inductive power from an external wireless power transmitter. Accordingly, the present invention could therefore be applicable to assess damage against any type of electromagnetic interface whether they support wireless charging or not.

The wireless power receiver circuits 32a, 32b mentioned herein could comprise at least one wireless power receiver coil as indicated in FIGS. 2 to 6. In view of FIG. 2 the first wireless power receiver coil 34a is tuned to an operating frequency which matches the wireless power transmitter coil 24 of the wireless power transmitter 22. A suitable load 36 may be provided to handle excess power received by the wireless power receiver coil 34a in the testing device 30. For instance, a suitably dimensioned resistor may be used.

On the other hand, the second wireless power receiver circuit may comprise a second wireless power receiver coil 34b being tuned for the operating frequency range associated with the wireless communication standard.

The first and second wireless power receiver circuits could be combined into a single circuit allowing for operation in two operating frequency ranges.

As shown in FIG. 2 the testing device 30 is connected to the host device 40 via a link 35. This link could be a wired cable connection or any other suitable connection allowing transfer of signals from the interface 33 of the testing device to the interface 41 of the processing means 42 of the host device 20.

In operation during a test session, the external wireless power transmitter device 20 will transfer power wirelessly to the testing device 30 by way of magnetic induction 18 via the wireless power transmitter coil 24 and the wireless power receiver circuit 34. During operation, the testing device 30 can control the operating mode of the wireless power transmitter device 20; specifically testing device 30 may be arranged to search for worst-case conditions. These worst-case conditions can be interpreted from different viewpoints, for example it could search for the highest distortion of NFC communication, or for the lowest induced voltage in RF detection networks.

The testing device 30 may optionally have one or more sensors 31 for detecting an operation condition of the testing device 30 during the test session. Measurement data from the sensor(s) 31 may be provided via an interface 33 in the testing device 30 to the host device 40 via an interface 41, as is seen in FIG. 2. For instance, the sensor(s) 31 may be thermo sensory means capable of measuring the thermal exposure of the testing device 30 caused by the wireless power transfer from the wireless power transmitter device 20. Suitable thermo sensory means are disclosed in detail in Swedish patent applications 1451306-3 and 1550340-2, the contents of which are incorporated herein by reference in their entirety.

The testing device 30 may optionally have one or more status indicators 32 for indicating a status of the testing device during the test session. The status indicator(s) 32 may be drivable by the host device 40 via the aforementioned interfaces 33, 41. Examples of status indicators include light emitting diodes, lamps, displays, buzzers, speakers and vibrators.

As mentioned above the host device 40 has a processing means 42 for measuring/analyzing the received power in any of the wireless power receiver circuits 34a, 34b by the testing device 30 over the link 35, and processing any measurement data received from the testing device 30 if applicable. The processing means 42 may comprise a programmable device, such as a microcontroller, central processing unit (CPU), digital signal processor (DSP) or field-programmable gate array (FPGA) with appropriate software and/or firmware, and/or dedicated hardware such as an application-specific integrated circuit (ASIC).

Furthermore, the host device 40 may have reporting means 43 for communicating or presenting results obtained by the processing means 42. This may involve presentation of graphical information on a local user interface (e.g. display) of the host device 40, generating of visual and/or audible alarms, or communication of information to a remote device, as indicated by 45 in FIG. 2.

The report could e.g. comprise a list of all known external devices, being at risk during normal operation, e.g. during active inductive charging, of the external power transmitter device. Typically, external devices can be classified into different categories based on their function, size, housing, environment, etc. The report can provide several assessments on wide ranges of external device classes based on the obtained results with the testing device 30 and host device 40. An example could be whether a card-type NFC receiver can be damaged even by the scanning signal present on many variations of Wireless power transmitter device 20. Another example could be at what transmitter operating points the quality of a Bluetooth communication signal from a mobile phone gets too low for reliable communication.

In one embodiment, measurement data may be associated with an induced voltage received in the respective wireless power receiver circuit 34*a*, 34*b*. In an embodiment where only one wireless power receiver circuit 34*a* is present, the measurement data may be associated with an induced voltage received in the wireless power receiver circuit 34*a*. The reference data may comprise information relating to a predetermined maximum induced voltage allowed to be received by a communication receiver circuit 15 in a known external device 10 without risk of damaging said communication receiver circuit 15.

The decision that the communication receiver circuit 15 provided in a particular external device 10 and arranged to communicate according to the wireless communication standard adopting the second frequency range, when arranged in operative proximity to the external wireless power transmitter device 20, would be negatively affected by the inductive power transmitted from the external wireless power transmitter device 20 may be made when the induced voltage is above the predetermined maximum induced voltage of said particular external device.

Other embodiments of the testing device 30 will now be described with reference to FIGS. 3 to 4.

Figure 3:
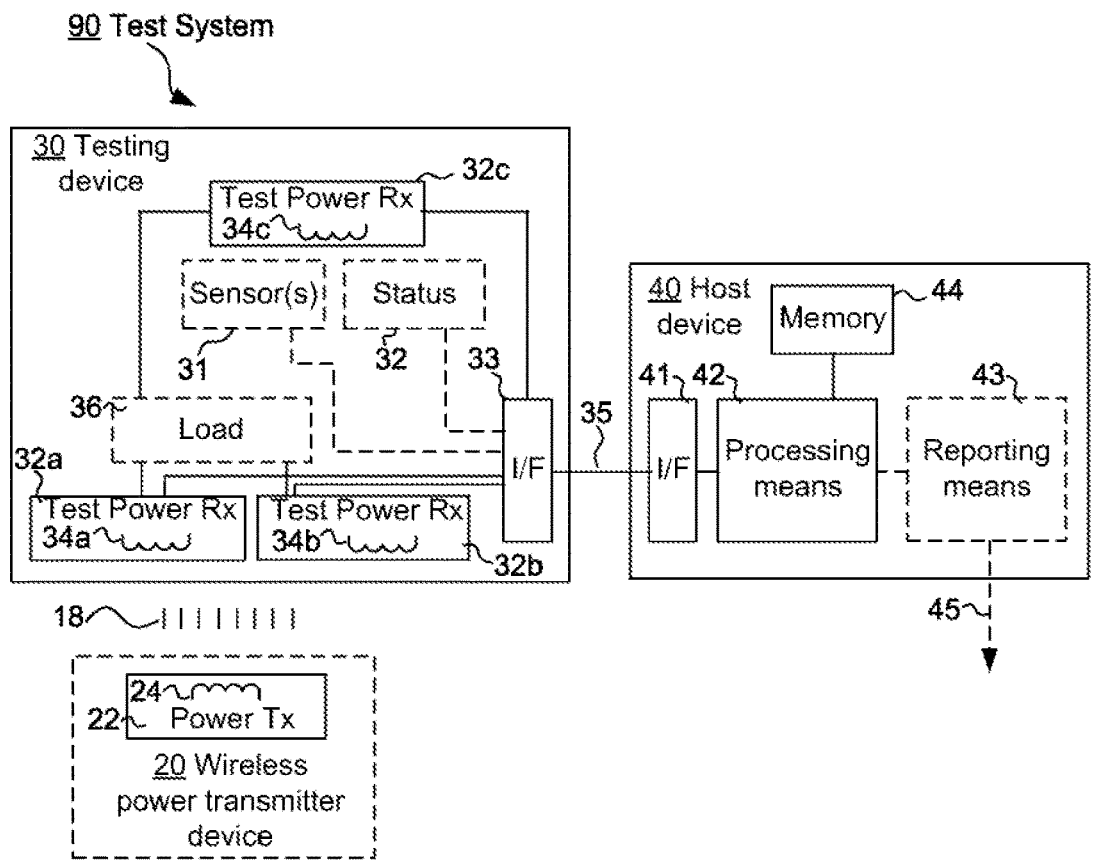
FIG. 3 is a schematic block diagram of a setup for testing of wireless power transfer, including a testing device, a wireless power transmitter device and a host device according to one embodiment.

With reference to FIG. 3 an additional wireless power receiver circuit 34*c* is provided. The additional wireless power receiver circuit 34*c* is connected in the same manner as the other wireless power receiver circuits and is therefore also operatively connected to the interface 33. By providing an additional wireless power receiver circuit 34*c* it is possible to tune this for a third operating frequency range, relating to a different wireless communication standard than that being associated with the second wireless power receiver circuit 34*b*. However, by positioning the additional wireless power receiver circuit at a distance away from the first or second wireless power receiver circuits it is possible to provide improved test results for those components being positioned at a similar distance away from the power receiver coil in the external device. The underlying idea here is that, for example, an NFC circuit being positioned further away from the power receiving coil of the external device or the external wireless power transmitter device 20 would be less affected by the inductive power transfer than if it would be positioned in close proximity to the external wireless power transmitter device. Hence, by knowing where vulnerable components are located in different external devices a more accurate test of vulnerability may be made using this setup. It should be noted that any number of additional wireless power receiver circuits could be added to the testing device.

Figure 4:
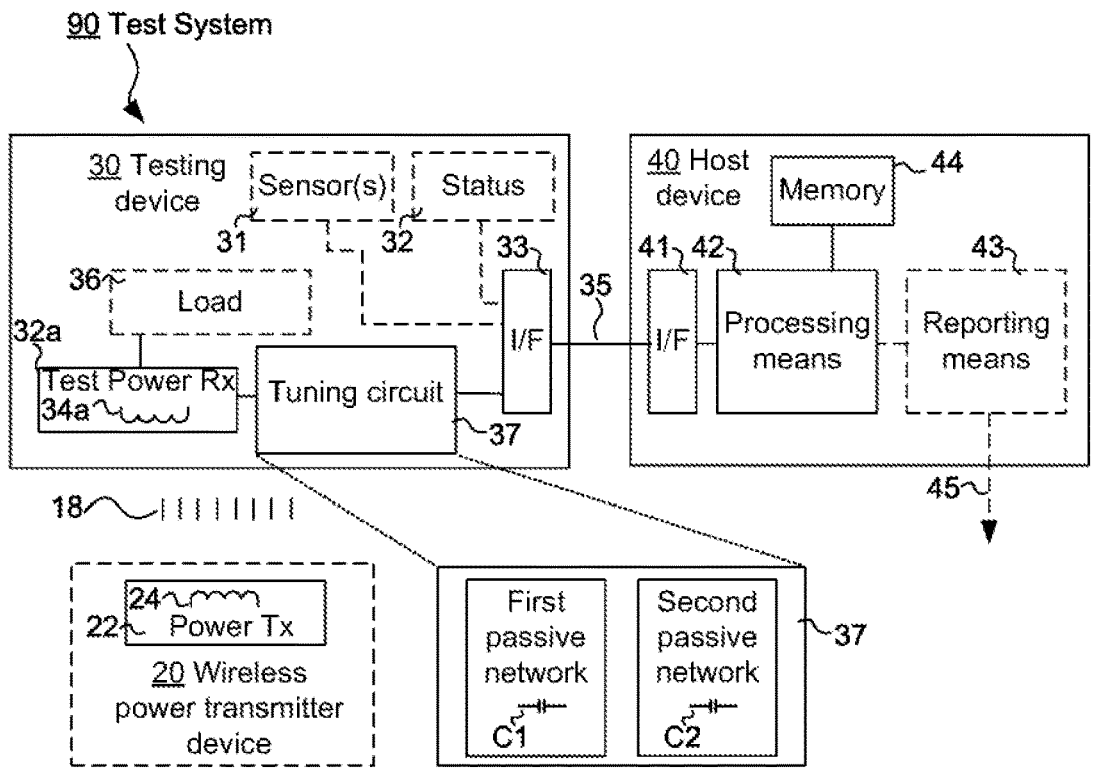
FIG. 4 is a schematic block diagram of a setup for testing of wireless power transfer, including a testing device, a wireless power transmitter device and a host device according to one embodiment.

Now turning to FIG. 4, another embodiment of the testing device 30 is shown. Here, instead of using at least two wireless power receiver circuits where each are tuned to a particular operating frequency range, a single wireless power receiver circuit 34*a* is used instead. In addition, a tuning circuit 37 is operatively connected thereto to tune the wireless power receiver circuit to different operating frequency ranges. Thereby, it is possible to achieve the same output from the testing device 20 as in the embodiments relating to FIG. 2 or 3.

The tuning circuit 37 may comprise a first capacitor C1 for tuning of an operation resonance frequency for wireless power transfer; and a second capacitor C2 for tuning of a detection resonance frequency for wireless communication standard. However, should be appreciated that any type of tuning circuit could be used, and hence also more complex tuning networks could be used to allow for the possibility of tuning to more than two operation resonance frequencies.

As seen particularly in FIG. 5, the testing device 30 in the disclosed embodiment may have the shape of a thin box. The testing device 30 has a housing 50 having a lower housing part 51 and an upper housing part 52. The lower housing part 51 has a bottom side adapted for placement on a surface of the wireless power transmitter device 20. The upper housing part 52 has a top side opposite to the bottom side. The lower housing part 51 may be made of plastic or another material suitable for admitting the inductive coupling 18 between the wireless power transmitter coil 24 of the external wireless power transmitter device 20 and the wireless power receiver circuit 34*a*, 34*b*, 34*c* of the testing device. The upper housing part 52 may also be made of plastic, or alternatively of a material, such as aluminum or glass, having heat dissipation properties similar to a typical mobile device that the wireless power transmitter device 20 is designed for use with.

As seen in FIG. 5 the testing device 30 may have a cable 60 which constitutes or at least forms a part of the link 35 to the host device 40, as referred to above in view of FIGS. 2 to 4. The cable 60 has a cable connector 70 which is connectable to the host device 40.

Reference is now made to the exploded isometric views in FIG. 6, illustrating the disclosed embodiment of the testing device 30 of FIG. 2 in a disassembled state. The wireless power receiver circuits 34*a*, 34*b* are provided inside the housing 50. As explained above, the testing device 30 may optionally include one or more sensors 31, one or more status indicators 30, and the interface 35. None of these optional elements are shown in FIG. 6 for reasons of brevity.

Although FIG. 6 illustrates two coils being separated from each other, it should be understood that the coils also could be arranged with a physical overlap. In some instances it may be beneficial to arrange the coils with at least some physical overlap.

As seen in FIG. 6, the cable 60 may extend from the housing 50 at a first end or second end. The cable 60 may accommodate connection wiring 63 of the wireless power receiver circuit 34*a*, 34*b*, which in this case are presented as coils. In the example setup of FIG. 6, the connection wiring 63 is the same physical wiring as makes up the loops of the respective wireless power receiver circuit 34*a*, 34*b*; the ends of the circuit 34*a*, 34*b* thus continue uninterrupted through the cable 60 to the cable connector 70. This arrangement is believed to be advantageous, since a signal junction between the loops of the circuit 34*a*, 34*b* and the start of the cable 60

(at the first end 61) has been avoided. In other embodiments, however, it may be possible to have a separate connection wiring 63 which connects to the loops of the circuits 34a, 34b somewhere at the first end 61.

The optional electronic memory 44 may contain reference data relating to the at least one wireless power receiver circuit 34a, b but in any case it contains reference data relating to at least one external device, but more likely a number of external devices, and its/their associated wireless communication receiver circuits 15. The electronic memory could be an EEPROM memory, such as for instance the integrated circuit DS24B33+ by Maxim Integrated, 160 Rio Robles, San Jose, Calif. 95134, USA. Various other types of electronic memories or other data storages may also be used, as is readily realized by a skilled person. Furthermore, the memory could also be incorporated in the host system or accessed at a later point in time when new characteristics of external circuits becomes available.

In embodiments where the testing device 30 includes a status indicator 32 for indicating a status of the testing device 30, an input of the status indicator 32 may be operatively connected to the processing means 42, e.g. via the wired cable connection, to render it controllable by the host device 40 for testing of wireless power transfer. Alternatively, the communication between the host device 40 and any or all of these optional elements may occur over a separate link (wired or wireless).

The reference data associated with the respective wireless power receiver coil 34a, 34b, 34c advantageously comprises a type or class of the wireless power receiver coil 34. For instance, when the wireless power receiver coil 34 is a Qi low power coil, its type or class may be indicated in the characteristic information as a value A, B, C, D, etc.

The indication of the actual coil type of the wireless power receiver coil 34 in the reference data will allow for the host device 40 to detect an error situation when a test operator inadvertently is about to start a test session for another instance of the test device 30 (i.e., based upon another coil type), than what was intended.

Advantageously, the reference data relating to the respective wireless power receiver circuit 34a, 34b, 34c may also comprise the following additional data, or parts thereof:

A unique identifier of the wireless power receiver coil 34. The unique identifier may, for instance, be given as a serial number.

An inductance value of the wireless power receiver coil 34, expressed as a numerical value in H (or magnitudes thereof).

A first resonance frequency of the wireless power receiver coil 34, expressed as a numerical value in Hz (or magnitudes thereof). The first resonance frequency will typically be an operation resonance frequency for wireless power transfer. For instance, for Qi low power applications, the first resonance frequency may be at about 100 kHz.

A second resonance frequency of the wireless power receiver coil 34, expressed as a numerical value in Hz (or magnitudes thereof). The second resonance frequency will typically be a detection resonance frequency for wireless power transfer. For Qi low power applications, the second resonance frequency may be at about 1 MHz.

A first equivalent series resistance, ESR, value for the wireless power receiver coil 34 at a first frequency, which may be aforesaid first resonance frequency. The first ESR value may be expressed as a numerical value in Ω (or magnitudes thereof).

A second equivalent series resistance, ESR, value for the wireless power receiver coil 34 at a second frequency, which may be different from aforesaid first resonance frequency. The second ESR value may be expressed as a numerical value in Ω (or magnitudes thereof).

A first Q value for the wireless power receiver coil 34 at the first frequency.

A second Q value for the wireless power receiver coil 34 at the second frequency.

A first bandwidth for the wireless power receiver coil 34 at the first frequency.

A second bandwidth value for the wireless power receiver coil 34 at the second frequency The additional data mentioned above will allow for the host device 40 to perform an accurate test session, being based on exact respective parameter values of the individual wireless power receiver coil 34. Also, it will allow for the host device 40 to perform compliance tests with respect to an applicable wireless power transfer standard, such as Qi.

FIG. 8 is a flowchart diagram of a method of testing wireless power transfer from an external wireless power transmitter device (such as device 20 as referred to above), having a wireless power transmitter coil (such as coil 24 as referred to above). The method comprises providing 110 a testing system 90 as mentioned above. The method further comprises placing 120 the testing device 30 of the testing system 90 on, at or near the external wireless power transmitter device 20. Furthermore, the method comprises connecting 130 the interface 35 to the host device 40. Moreover, the method comprises receiving 140, by the processing means 42, measurement data originating from the first wireless power receiver circuit 34a or second wireless power receiver 34b. The method further comprises accessing 150 reference data related to characteristics of the wireless communication standard adopting the second frequency range. Furthermore, the method comprises determining 160, by the processing means 42, whether a communication receiver circuit 15 provided in an external device 10 and arranged to communicate according to the wireless communication standard adopting the second frequency range, when arranged in operative proximity to the external wireless power transmitter device 20, would be negatively affected by the inductive power transmitted from the external wireless power transmitter device 20, based on a comparison between the measurement data associated with the second frequency range and the reference data.

The method may further comprise tuning 170, by the tuning circuit 37, the operating frequency range of the first wireless power receiver circuit 34a to enable detection of wireless power transmitted from the external wireless power transmitter device 20 in the first wireless power receiver circuit 34a according to both a wireless power standard adopting a first operating frequency range and a wireless communication standard adopting a second operating frequency range being different from the first operating frequency range.

The equipment and procedures described above will allow testing of wireless power transfer for the benefit of various potential interest groups, such as any or all of the following:

Developers, manufacturers or suppliers of wireless power transmitter devices,

Test or compliance entities in the field of wireless power transfer,

Test or compliance entities in the field of consumer product safety.

In yet one further embodiment, the test equipment combines the measurement equipment for two different standards with the overlapping area of electromagnetic fields. This could be for example combining a test system for Qi (Wireless Power Consortium) with a test system to measure NFC (Near Field Communication Forum) parameters. This allows the system to act as a device from one standard and measure (at the same time) signals relating to a different standard, thus combining coexistence testing in a single tool. The interference detection hence allows checking the performance of a first device against both standards. More specifically, it can do this at the same time. This has several benefits; a reduction in test equipment needed, measurement on the impact on standard 2 while the compliance with standard 1 is checked at the exact same time, and test equipment for standard 1 can force/control the Device A into 'worst-case' situations to fully analyze the impact under many different circumstances as compared to the typical setup that is possibly with the conventional tools/methodology.

An example implementation of the invention is where the functionality of a wireless power receiver is combined with the wireless communication receiver in such a way that while wireless power receiver is testing a device (or even forcing the device into different situations needed for checking conformance with a standard or checking performance characteristics in general) it can also measure the impact of these operating conditions into a wireless communication receiver by emulating different wireless communication receiver executions.

The invention has been described above in detail with reference to embodiments thereof. However, as is readily understood by those skilled in the art, other embodiments are equally possible within the scope of the present invention, as defined by the appended claims.

What is claimed is:

1. A testing system for use in testing of wireless power transfer, the testing system comprising:
a host device; and
a testing device, the testing device having:
a first wireless power receiver circuit arranged to receive inductive power from an external wireless power transmitter device; wherein the testing system further comprises a circuit selected from the group consisting of:
a tuning circuit for tuning the operating frequency range of the first wireless power receiver circuit to enable detection of wireless power transmitted from the external wireless power transmitter device in the first wireless power receiver circuit according to both a wireless power standard adopting a first operating frequency range and a wireless communication standard adopting a second operating frequency range being different from the first operating frequency range or
a second wireless power receiver circuit arranged to receive inductive power in a second operating frequency range according to a wireless communication standard adopting a second operating frequency range, wherein the first wireless power receiver circuit is arranged to receive inductive power in a first operating frequency range according to a wireless power standard, and wherein the second operating frequency range is different from the first operating range;
the testing device further having
an interface operatively coupled either to the first wireless power receiver circuit when the selected circuit is said tuning circuit or to the first and second wireless power receiver circuits when the selected circuit is said second wireless power receiver circuit, the interface being arranged to provide measurement data to the host device;
the host device comprising:
a processing means operatively coupled to an electronic memory having stored thereon reference data related to characteristics of the wireless communication standard adopting the second frequency range; wherein the processing means is arranged to:
receive the measurement data associated with the second frequency range from the interface, and
determine whether a communication receiver circuit provided in an external device and arranged to communicate according to the wireless communication standard adopting the second frequency range, when arranged in operative proximity to the external wireless power transmitter device, would be negatively affected by the inductive power transmitted from the external wireless power transmitter device, based on a comparison between the measurement data associated with the second frequency range and the reference data.

2. The testing system according to claim 1, wherein the measurement data is associated with an induced voltage received in the respective wireless power receiver circuit.

3. The testing system according to claim 2,
wherein the reference data comprises information relating to a predetermined maximum induced voltage allowed to be received by a communication receiver circuit in a known external device without risk of damaging said communication receiver circuit, and
wherein a decision that the communication receiver circuit provided in a particular external device and arranged to communicate according to the wireless communication standard adopting the second frequency range, when arranged in operative proximity to the external wireless power transmitter device, would be negatively affected by the inductive power transmitted from the external wireless power transmitter device is made when the induced voltage is above the predetermined maximum induced voltage of said particular external device.

4. The testing system according to claim 1, wherein the reference data comprises information relating to a predetermined maximum induced voltage allowed to be received by a communication receiver circuit in a known external device without risk of damaging said communication receiver circuit.

5. The testing system as defined in claim 1, wherein the host device further comprises a reporting means or communicating or presenting test results obtained by the processing means.

6. The testing system as defined in claim 1, wherein the first wireless power receiver circuit comprises a coil.

7. The testing system as defined claim 1, the selected circuit being said second wireless power receiver circuit, wherein the second wireless power receiver circuit comprises an antenna.

8. The testing system as defined claim 1, the selected circuit being said tuning circuit, wherein the tuning circuit comprises:
a first passive network for tuning of an operation resonance frequency for wireless power transfer; and
a second passive network for tuning of a detection resonance frequency for communication signals.

9. The testing system as defined in claim 8, wherein the reference data further comprises information about respective capacitance values of a first capacitor comprised in said first passive network and of a second capacitor comprised in said second passive network.

10. The testing system as defined in claim 1, wherein the testing device comprises a housing in which the at least first wireless receiver circuit is provided, the housing having a lower housing part with a bottom side adapted for placement on a surface of the external wireless power transmitter device having a wireless power transmitter coil, and an upper housing part.

11. A method of testing wireless power transfer from an external wireless power transmitter device having a wireless power transmitter coil, the method involving:
  providing a testing system as defined in claim 1;
  placing the testing device of the testing system on, at or near the external wireless power transmitter device;
  connecting the interface to the host device;
  receiving, by the processing means, measurement data originating from the first wireless power receiver circuit or second wireless power receiver circuit;
  accessing reference data related to characteristics of the wireless communication standard adopting the second frequency range; and
  determining, by the processing means of the host device, whether a communication receiver circuit provided in an external device and arranged to communicate according to the wireless communication standard adopting the second frequency range, when arranged in operative proximity to the external wireless power transmitter device, would be negatively affected by the inductive power transmitted from the external wireless power transmitter device, based on a comparison between the measurement data associated with the second frequency range and the reference data.

* * * * *